United States Patent [19]
McAnally et al.

[11] Patent Number: 6,070,742
[45] Date of Patent: Jun. 6, 2000

[54] MULTI-SEGMENT, NESTING, LOW PROFILE CABLE MANAGEMENT ARM

[75] Inventors: Andrew L. McAnally, Georgetown; Christopher S. Beall, Houston, both of Tex.

[73] Assignee: Dell USA, L.P., Round Rock, Tex.

[21] Appl. No.: 09/181,289

[22] Filed: Oct. 28, 1998

[51] Int. Cl.[7] ........................................... A47F 5/00
[52] U.S. Cl. ............................ 211/26; 361/727; 361/826
[58] Field of Search .......................... 211/26; 312/265.1, 312/265.4; 361/725, 727, 826, 827

[56] References Cited

U.S. PATENT DOCUMENTS

| | | | |
|---|---|---|---|
| D. 318,269 | 7/1991 | Hassel et al. | D13/155 |
| D. 363,701 | 10/1995 | Paquette et al. | D13/154 |
| 5,018,052 | 5/1991 | Ammon et al. | 361/428 |
| 5,149,277 | 9/1992 | LeMaster | 439/207 |
| 5,216,579 | 6/1993 | Basara et al. | 361/383 |
| 5,460,441 | 10/1995 | Hastings et al. | 312/298 |
| 5,571,256 | 11/1996 | Good et al. | 211/26 |
| 5,655,738 | 8/1997 | Ragsdale et al. | 248/68.1 |
| 5,726,866 | 3/1998 | Allen | 361/727 X |
| 5,890,602 | 4/1999 | Schmitt | 211/13.1 |

OTHER PUBLICATIONS

"AMP Introduces WIMS For Flexible, Modular Cable Management," Nov. 6, 1996, 2 pages, Http://www.amp.com/fiberoptics/wims.html.

"Cable Management Glossary of Terms," 2 pages, Http://www.tritelchicago.com/equipment/data/glossary.html.

*Primary Examiner*—Robert W. Gibson, Jr.
*Attorney, Agent, or Firm*—Skjerven, Morrill, MacPherson, Franklin & Friel, LLP; Stephen A. Terrile; Joseph T. Van Leeuwen

[57] ABSTRACT

A foldable cable management apparatus for holding cables in a rack mounted system. The apparatus includes a plurality of segments pivotally attached to one another. One or more of the plurality of segments include cable trays for holding the cables and include cable fasteners. One or more of the plurality of segments is adapted to nest with other segments so that the combined depth of the apparatus is less than the sum of the depths of the individual segments. In a three segment embodiment, a first segment of the plurality of segments is pivotally attached to a first attachment plate, the first attachment plate securing the first segment to a rack and also pivotally attached to a second segment of the plurality of segments, which in turn is pivotally attached to a third segment of the plurality of segments, the third segment being pivotally attached to a rack mounted component, wherein the cable tray of the third segment substantially fits within the depth of the second segment and adjacent to the channel formed in the second segment when the third segment is folded into the second segment.

27 Claims, 11 Drawing Sheets

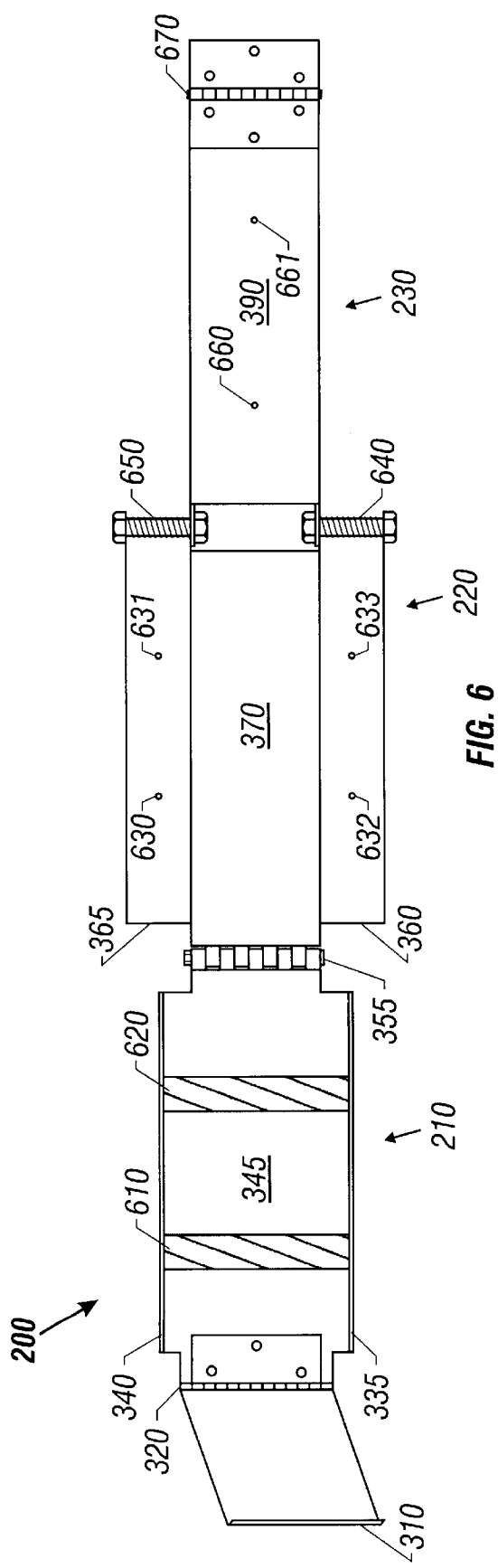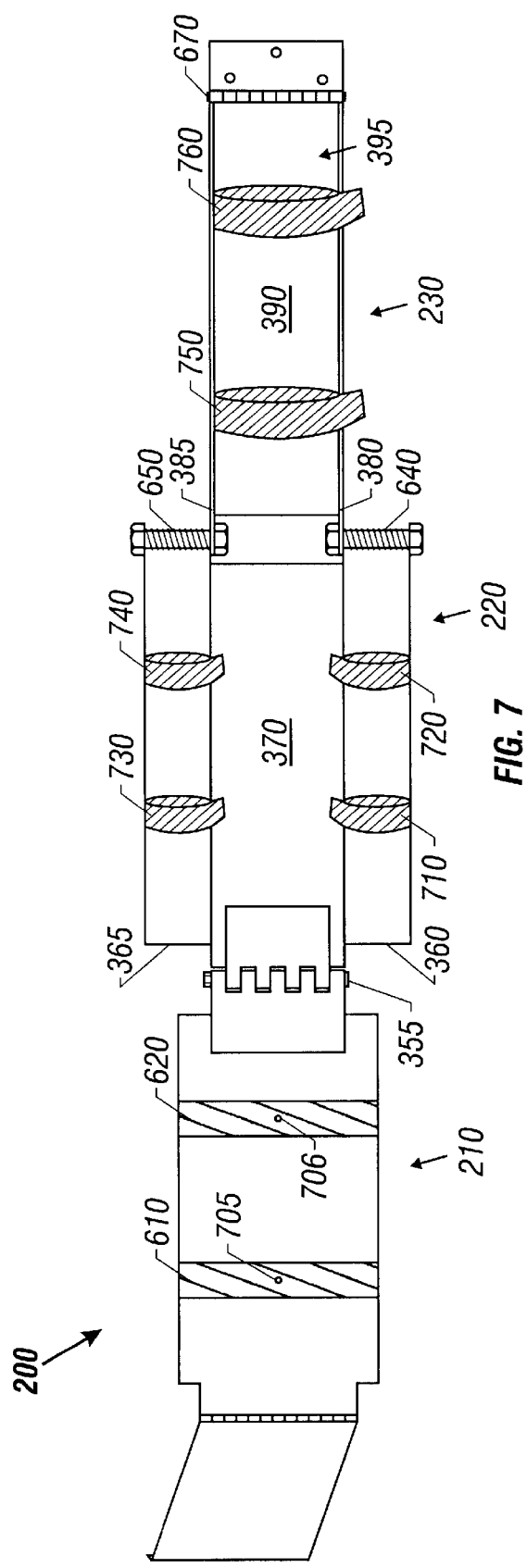

MULTI-SEGMENT, NESTING, LOW PROFILE CABLE MANAGEMENT ARM

BACKGROUND

1. Field

The present invention generally relates to rack-mounted computer systems, and more particularly relates to cable-arm assemblies used with rack-mounted computer systems.

2. Description of the Related Art

Computer systems are often mounted in rack-mounted structures. Rack-mounted structures enable computer components to be installed vertically, taking up less floor space in a computer operations area. Multiple rack-mounted structures can be installed in a computer area allowing for growth and flexibility of the components installed. Rack-mounted structures are typically vertical with individual components mounted in with side mounted slides that attach to the rack. The individual components can then be slid into and out of the rack. In this manner, the individual components can be accessed for repairing the unit, providing upgrades, configuring the unit, connecting the unit to other components, and other tasks.

Rack-mounted systems are typically air-cooled so ventilation is provided by having air pass through the individual components, often through the individual component from the front of the component to the back of the component. In this way, other components above and below the individual component will not block the air flow through the unit.

Some of the individual components often included in a rack system include servers, other computers, and direct access storage devices, such as disk drives and RAID subsystems. Access to components is provided by the slidable structure attached to the internal frame portion of the rack. In this way, components can be moved to a forwardly extended component access position for servicing. When not being serviced, the component is moved to a rearwardly retracted operating position.

Each component generally has a variety of cables attaching the component to power sources, communication networks, and other components. Each component generally has at least one power cable which provides power to the component's power supply. Components also have cables connecting the unit with other components both inside and outside the rack. For example, a typical computer system component connects to a video display device for an operator to view the operation of the computer system, a printer for printing, a network adapter for communicating with other computer systems on a local area network (LAN), a modem for connecting to other computers over the telephone system, external storage devices such as disk drives, RAID drives, optical disks, and tape drives. Each of these connections usually involves attaching a cable to the component. These connections are usually made at the back of the unit by connecting the cable to connectors provided on interface cards installed in the computer or connectors provided on the back of the individual component.

All these connections can lead to a large quantity of cables connecting to individual components as well as large numbers of cables within the rack. The components in the rack slide to a forwardly extended component access position and slide back to a rearwardly retracted operating position, cables are extended to an additional length so the component can be slid to the forwardly extended component access position without the cables snagging or becoming removed from the component. Likewise, when a particular component is moved to the rearwardly retracted operating position, the excess length of cables needs to be handled so that they do not become entangled with cables attached to other components above and below the particular component.

Cable arms are often provided to provide a structure to which the cables are fastened. FIG. 1 shows a prior art cable arm 100 which is commonly used. Prior art cable arm 100 includes a first prior art segment 110 and a second prior art segment 120. Prior art hinge 130 attaches first prior art segment 110 to second prior art segment 120 so that when component 140 is in the rearwardly retracted operating position, prior art hinge 130 allows the back of first prior art segment 110 to be substantially flat against the back of second prior art segment 120. A hinge attaches first prior art segment 110 to rack 160 while prior art hinge 170 attaches second prior art segment 120 to component 140. Cables 150 attach to component 140, extend along front side of second prior art segment 120, wrap around prior art hinge 130, and extend along front side of first prior art segment 110 before reaching the back of rack 160.

Prior art cable arm 100 allows component to be forwardly extended to a length not exceeding the length of prior art cable arm 100. Prior art cable arm 100 in turn is limited to a maximum length of twice the interior width of rack 160. A challenge in the use of prior art cable arm 100 is a difficulty encountered in extending component 140 enough to adequately work on a component. Adding additional segments to prior art cable arm 100 poses additional challenges as additional hinged segments restrict cables 150 from wrapping from segments 110 and 120 to additional segments. Another challenge is encountered when the arm is extended by adding segments without greatly increasing the depth taken by prior art cable arm 100 in rack 160 when the component is in the rearwardly retracted operating position. Limited space is often provided between the back of component 140 and the back of rack 160. This limited amount of space may prohibit a deeper cable arm with additional segments from being used because component 140 would not be able to completely reach a rearwardly retracted operating position.

It is desirable to provide a longer cable arm without greatly increasing the depth of the cable arm. It is further desirable to allow cables to wrap from segment to segment with minimal restriction.

SUMMARY

A cable arm of the present invention is extended in length by allowing more than two segments in a cable arm connecting a rack to a component mounted in a computer rack. Segments of the cable arm overlap or fit within one another to reduce the depth requirement of the cable arm when the component is pushed into the rearwardly retracted operating position. Cables wrap around the pivotal connections between the segments and are secured using cable fasteners. Cable channels are provided on segments for guiding and supporting the cables. By using more than two segments, the component can be moved into a forwardly extended component access position allowing more room to access and service the component than is provided by cable arms with only two segments.

BRIEF DESCRIPTION OF THE DRAWINGS

The present invention may be better understood, and its numerous objects, features, and advantages made apparent to those skilled in the art by referencing the accompanying drawings.

FIG. 6 is a front view of the cable management arm.

FIG. 7 is a back view of the cable management arm.

The use of the same reference symbols in different drawings indicates similar or identical items.

DESCRIPTION OF THE PREFERRED EMBODIMENT(S)

Figure 1:
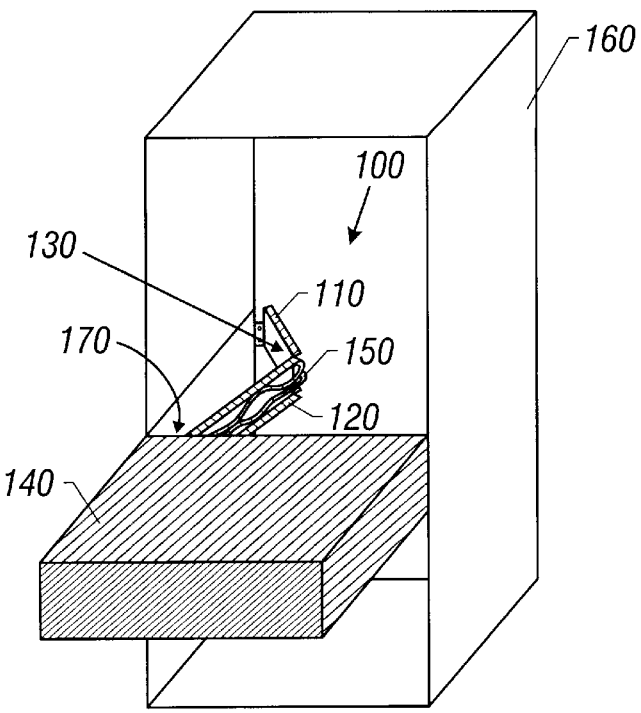
FIG. 1 is a perspective of a prior art two segment cable managment arm.
Figure 2:
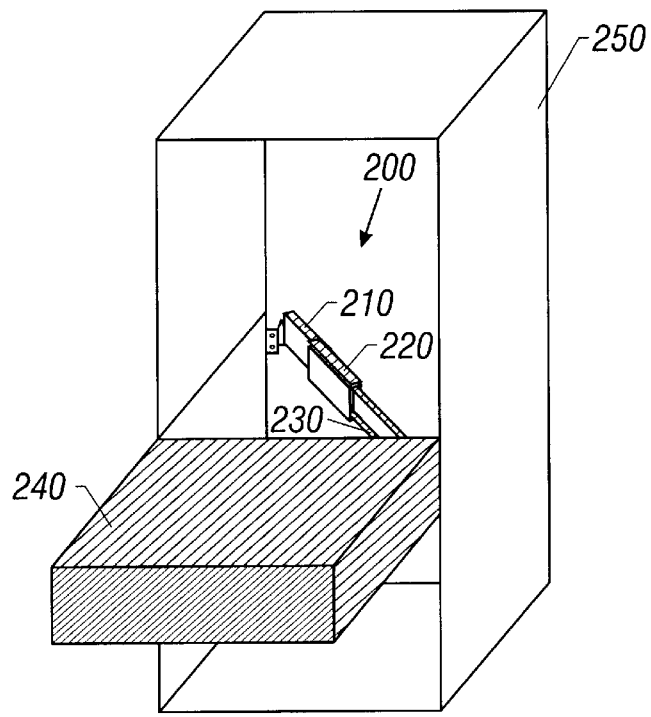
FIG. 2 is a perspective of the cable management arm of the present invention attached to a component and a rack in a forwardly extended component access position.

FIG. 2 shows cable arm 200 attaching component 240 slidably mounted in rack 250. In one embodiment, cable arm 200 includes three segments: first segment 210, second segment 220 and third segment 230. In this embodiment, cable arm 200 forms the hypotenuse of a right triangle when component 240 is in the forwardly extended component access position (as shown). The back of component 240 and side of rack 250 form the legs of the right triangle. First segment 210 is pivotally attached to rack 250 while third segment 230 is pivotally attached to component 240. First segment 210 is also pivotally attached to second segment 220 and second segment 220 is pivotally attached to third segment 230. When component 240 is positioned into rack 250 cable arm 200 becomes Z-shaped as the segments pivot towards one another.

It will be appreciated by those skilled in the art that various combinations and quantities of first segment 210, second segment 220, and third segment 230 are possible to create cable arms of various lengths.

Figure 3:
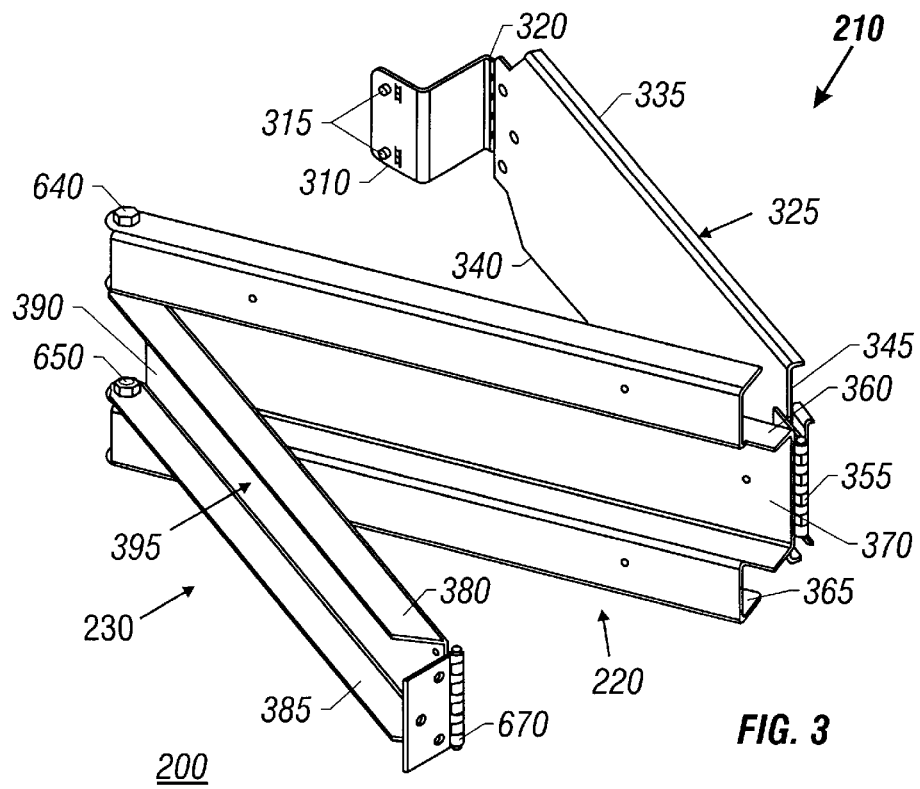
FIG. 3 is a perspective of the cable managment arm of the present invention.

FIG. 3 shows cable arm 200 in a Z-shaped intermediate position between the rearwardly retracted operating position and the forwardly extended component access position. Rack attachment plate 310 attaches cable arm 200 to rack 250 (not shown) using fasteners, such as screws or other equivalent attachment structures, engaged through apertures 315. Rack attachment plate 310 is pivotally attached to first segment 210 using hinge 320. First segment 210 includes a first cable tray 325 which is formed from first cable tray upper side 335, first cable tray lower side 340, and first cable tray surface 345. First segment 210 is pivotally attached to second segment 220 with hinge 355. Second segment 220 includes two cable channels, upper cable channel 360 and lower cable channel 365. When cable arm 200 is in the rearwardly retracted operating position, upper cable channel 360 and lower cable channel 365 face the same direction as first cable tray surface 345. When cable arm 200 is fully extended in the forwardly extended component access position, upper cable channel 360 and lower cable channel 365 each face in the opposite direction as first cable tray surface 345. Receiving channel 370 is formed by attaching an edge of upper cable channel 360 a corresponding edge of lower cable channel 365 with a planar surface. Third segment 230 pivotally attaches to second segment 220 with a pair of bolt/nut combinations 640 and 650 so that the width and depth of third segment 230 fits into receiving channel 370 of second segment 220 when cable arm 200 is in the rearwardly retracted operating position. Third segment 230 includes a cable tray formed from third cable tray upper side 380, third cable tray lower side 385, third cable tray surface 390, and hinge 670. Third cable channel 395 is formed from third cable tray upper side 380, third cable tray lower side 385, and third cable tray surface 390 and fits within receiving channel 370. When cable arm 200 is in the rearwardly retracted operating position, the back side of third cable tray surface 390 rests flat against receiving channel 370 of second segment 220. In one embodiment, the width of third cable tray surface 390 is roughly equal to the sum of the widths of upper cable channel 360 and lower cable channel 365 so that the same amount of cable can be accommodated by second segment 220 and third segment 230. In one embodiment (not shown), second segment 220 only has one cable channel 360 which is roughly half the width of second segment 220 with the other half width being a receiving plate which is similar to receiving channel 370 but does not need an opposing side.

Figure 4:
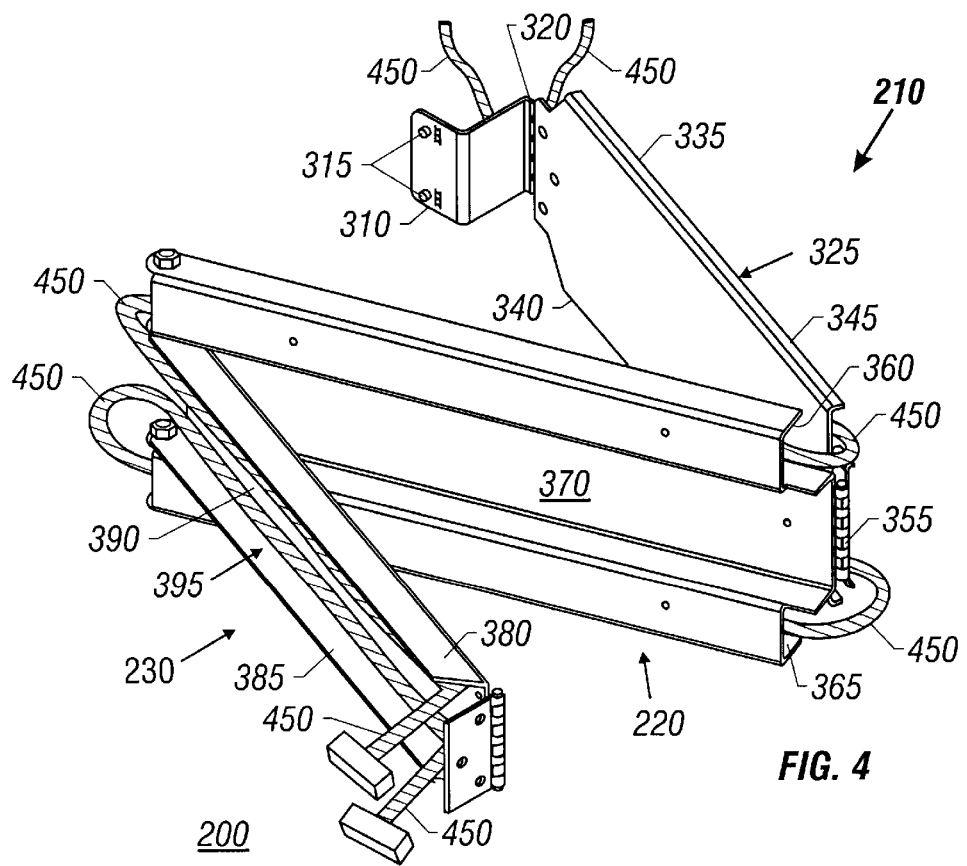
FIG. 4 is a perspective of the cable managment arm with cables.

FIG. 4 shows the direction cables travel through cable arm 200. Cables 450 first enter first segment 210 from the back of rack 250 (not shown) and travel along first cable tray surface 345. First cable tray surface 345 is hidden in this view by back of first segment 210. After the cables are extended along first cable tray surface 345, cables 450 are divided into an upper and lower group with the upper group travelling along upper cable channel 360 and the lower group travelling along lower cable channel 365. After the upper and lower group cables are extended along the lengths of respective upper and lower cable channels (360 and 365), the cables wrap from second segment 220 to third segment 230 and the upper and lower group cables combine and travel along third segment 230 along third cable tray surface 390. As can be seen in FIG. 4, when second segment 220 is pressed flat against first segment 210 cables 450 pass unencumbered through upper cable channel 360 and lower cable channel 365.

Figure 5:
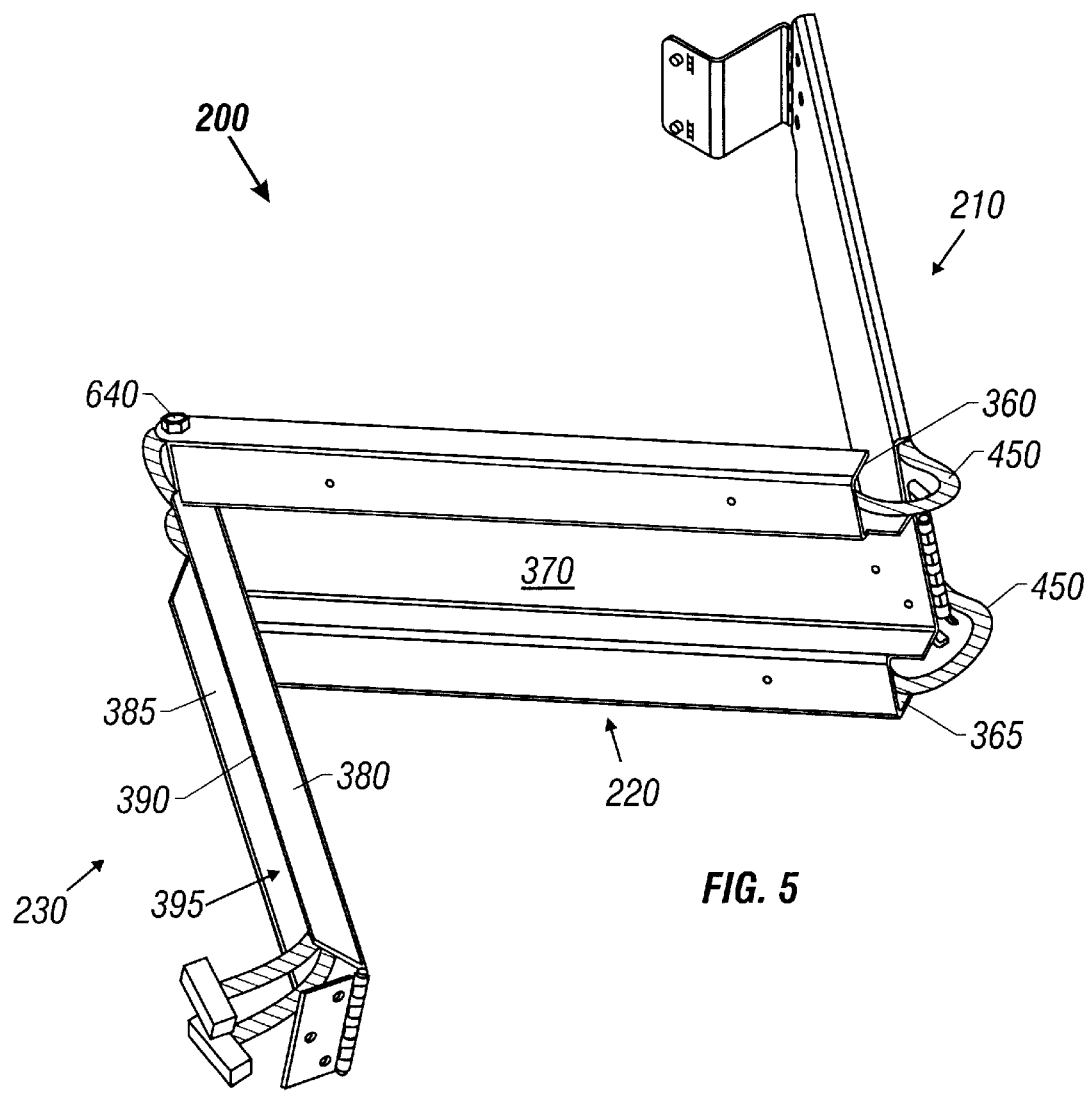
FIG. 5 perspective of the cable managment arm extended in a forwardly extended component access position with cables attached to the cable managment arm.

FIG. 5 shows cable arm 200 in an intermediate forwardly extended component access position extending away from component 240. In this view, cable arm 200 is shown disconnected from component 240 so that cables 450 may be seen exiting third segment 230. Component 240 would typically be a pivotally attached to third segment 230 using a hinge or other pivotal apparatus. In FIG. 5 cables 450 are shown extended along first segment 210 until they enter upper cable channel 360 and lower cable channel 365 of second segment 220. In order to enter upper and lower cable channels 360 and 365, the group of cables are divided with approximately half of the cables are directed towards the top portion of first cable tray surface 345 and the other half directed towards the lower half of first cable tray surface 345. From the perspective shown in FIG. 5, cables 450 cannot be seen extended along upper cable channel 360 and lower cable channel 365 as the cables are hidden by the walls of the respective cable channels. After cables are extended along upper and lower cable channels (360 and 365) they bend from the respective channels to third cable tray surface 390 in third segment 230. As upper channel 360 and lower channel 365 are on either side of third cable tray surface 390, the cables from upper cable channel 360 bend down while the cables from lower cable channel 365 bend up in order to enter third cable tray surface 390.

FIG. 6 shows a front view of cable arm 200 extended in the forwardly extended component access position. Rack attachment plate 310 is pivotally attached to first segment 210 with hinge 320. First segment 210 includes first cable tray surface 345. Cables are guided and kept from rising above or below first cable tray surface 345 by first cable tray upper side 335 and first cable tray lower side 340. Two cable fasteners, 610 and 620 are shown extended vertically across first cable tray surface 345. Cable fasteners can be formed of a hook and loop type fastener (i.e., Velcro®), bungee cords, cable ties, or other known fasteners. In one embodiment, hook and loop type cable fasteners are used so that the fastener can be easily removed and refastened in order to more easily add and subtract cables when reconfiguring or working with component 240. Cable fasteners 610 and 620 keep cables (not shown) flat against first cable tray surface 345 and prevent cables from extending out from first cable tray surface 345. Hinge 355 pivotally connects first segment 210 to second segment 220. From the view of FIG. 6, the back side of upper and lower cable channels (360 and 365) is shown above and below receiving channel 370. The front surface of receiving channel 370 can be seen which will lay flat against third segment 230 when third segment 230 is pivoted into second segment 220. The back side of rivets 630, 631, 632, and 633 which connect cable fasteners (not shown) to upper and lower cable channels (360 and 365) can also be seen. Second segment 220 is pivotally attached to third segment 230 with bolt/nut combinations 640 and 650. The backside of third cable tray surface 390 can be seen. The back side of rivets 660 and 661 can be seen which attach cable fasteners (not shown) onto the front surface of third cable tray surface 390. Hinge 670 attaches to the end of third segment 230 opposite the end attached to second segment 220. Hinge 670 allows cable arm 200 to be pivotally attached to a component (not shown).

FIG. 7 shows the opposite side of cable arm 200 as was shown in FIG. 6. The backside of cable fasteners 610 and 620, which each wrap completely around first segment 210, are attached to first segment 210 with rivets 705 and 706. First segment 210 is pivotally attached to second segment 220 with hinge 355. Upper cable channel 360 and lower cable channel 365 are visible along with the backside of receiving channel 370. Upper cable channel 360 includes two cable fasteners 710 and 720 and lower cable channel also includes two cable fasteners 730 and 740. Unlike cable fasteners 610 and 620 used with first segment 210, cable fasteners 710, 720, 730 and 740 are contained within their respective channels and do not wrap completely around second segment 220. Cable fasteners are not wrapped completely around second segment 220 because wrapping cable fasteners completely around second segment 220 would block receiving channel 370 and prevent third segment 230 from folding into receiving channel 370. Bolt/nut combinations 640 and 650 pivotally connect second segment 220 to third segment 230. The side edges of upper and lower channels 360 and 365 extend slightly farther than the floor of the respective receiving channel toward third segment 230 with an aperture formed in the side edges to insert bolt/nut combinations 640 and 650. The third cable tray upper side 380 and third cable tray lower side 385 extend toward second segment 220 with apertures in each tray side (380 and 385) to insert bold/nut combinations 640 and 650 and provide a pivotal attachment between second segment 220 and third segment 230. Cable fasteners 750 and 760 are contained within third cable channel 395. Cable fasteners 750 and 760 could be wrapped around third cable channel 395 but the extra thickness of the cable fasteners would have to be subtracted from the width of third cable channel 395 so that third cable channel 395 could fit within receiving channel 370. Hinge 670 is shown attached to third cable tray surface 390 with rivets or other fastening means. Reducing sharp edges on the fastener portion used on third cable tray surface 390 is helpful in reducing the risk of cables being torn or damaged.

Figure 8A:
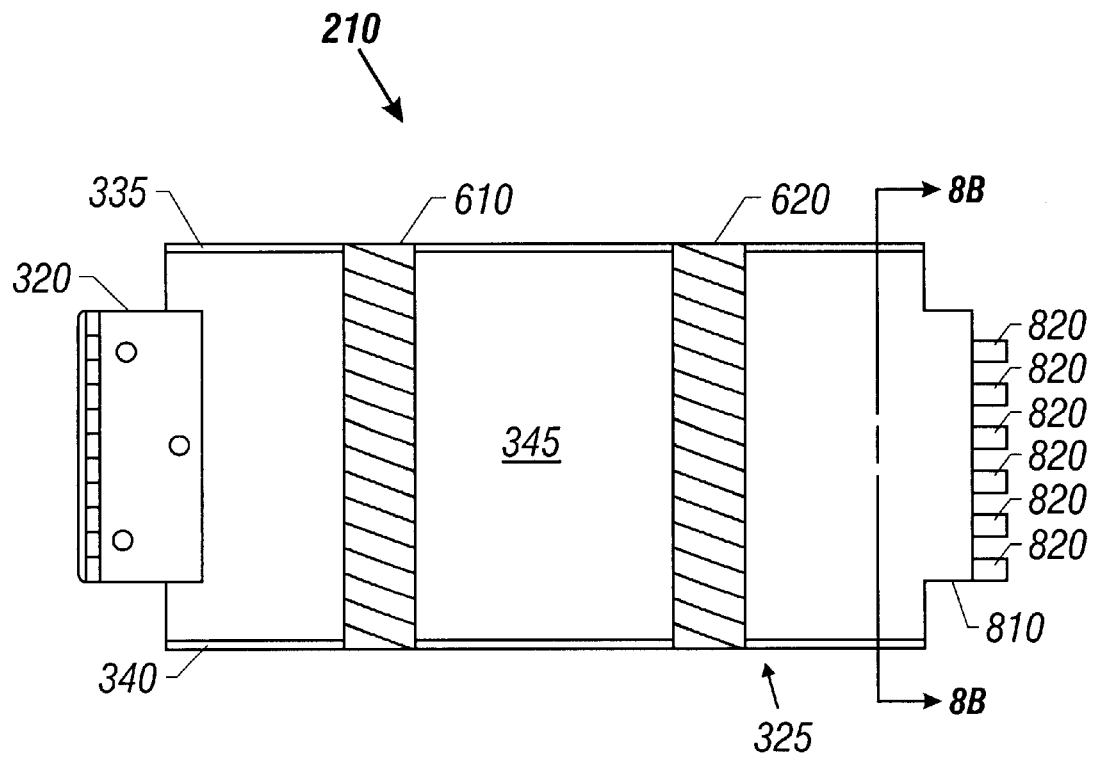
FIG. 8A is a front view of the first segment of the cable management arm.

FIG. 8a shows a front view of first segment 210. Hinge 320 attaches to a portion of first cable tray surface 345 which extends slightly from first cable tray surface 345 to provide a surface to mount hinge 320. The extended portion is essentially a mirror image of extended portion 810 but cannot be seen because it is covered by hinge 320. The edge of first cable tray upper side 335 and first cable tray lower side 340 are shown extending horizontally the length of first cable tray surface 345. Cable fasteners 610 and 620 are shown extending vertically across first cable tray 325. In one embodiment, cable fasteners 610 and 620 wrap completely around first segment 210. Hinge loops 820 are attached to extended portion 810 and provide loops to insert hinge pin (not shown) to attach first segment 210 to second segment 220 (not shown).

Figure 8B:
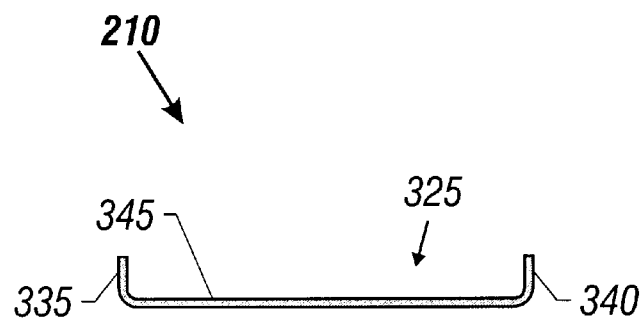
FIG. 8B is a cross sectional view of the first segment of the cable management arm.

FIG. 8b shows a cross sectional view along the cross sectional line 8b—8b from FIG. 8a without cable fasteners 610 and 620 being attached. Cable tray 325 of first segment 210 is seen as U-shaped with first cable tray upper side 335 and first cable tray lower side 340 extending vertically from first cable tray surface 345.

Figure 9A:
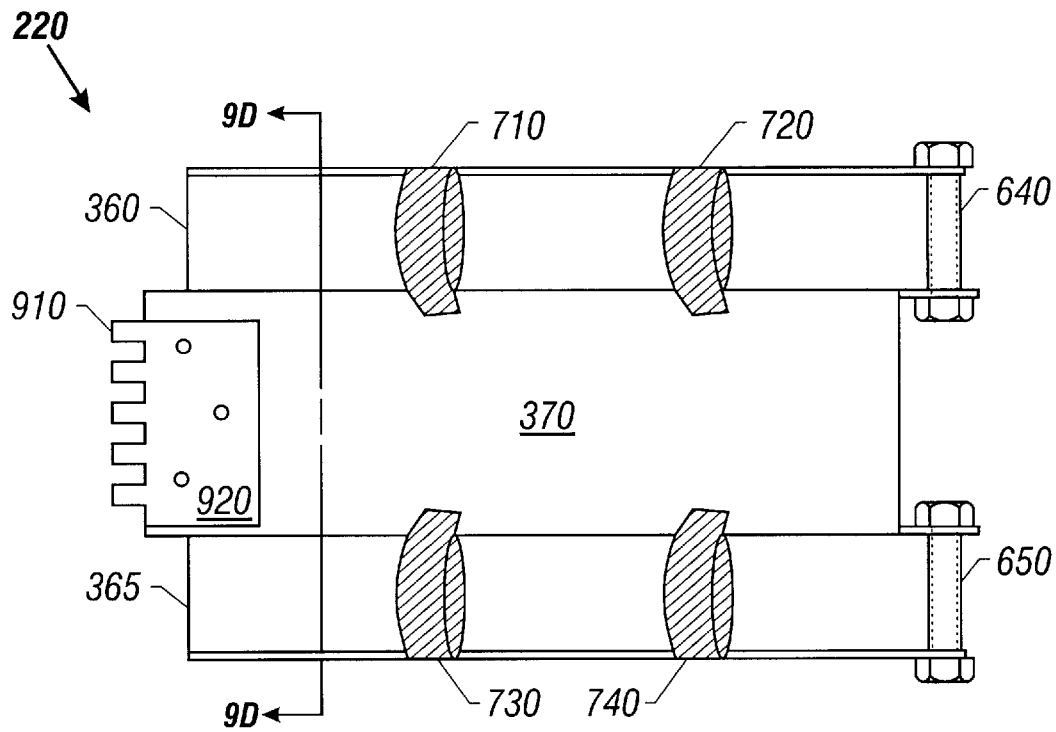
FIG. 9A is a front view of the second segment of the cable management arm.

FIG. 9a shows a front view of second segment 220. Hinge section 910 corresponds with hinge loops 820 from first segment 210 so that hinge section 910 can be inserted into hinge loops 820 (see FIG. 8a) and pivotally fastened with a hinge pin (not shown). Hinge section 910 extend from hinge plate 920 which is attached to receiving channel 370 using fasteners such as rivets. Receiving channel 370 extends outward from upper cable channel 360 and lower cable channel 365 and hinge plate 920 is attached to the extended portion. Upper cable channel 360 and lower cable channel 365 extend horizontally along the upper and lower portions of second segment 220. Within each cable channel, cable fasteners (710, 720, 730, and 740) are attached using rivets or other fasteners so that cable fasteners can loop around cables and keep the cables within the respective cable channel. Upper cable channel 360 and lower cable channel 365 extend outward from receiving channel 370 with the sides of the respective cable channels extending outward slightly past the floor of the cable channels with apertures in each cable channel side surface to allow bolt/nut combinations 640 and 650 to be inserted and fastened across the width of the respective cable channel. Receiving channel 370 is elevated so that the floor of receiving channel 370 is the same height as the walls forming cable channels 360 and 365. FIG. 9d shows a cross sectional view of second segment 220 along the cross sectional line 9d—9d.

Figure 9B:
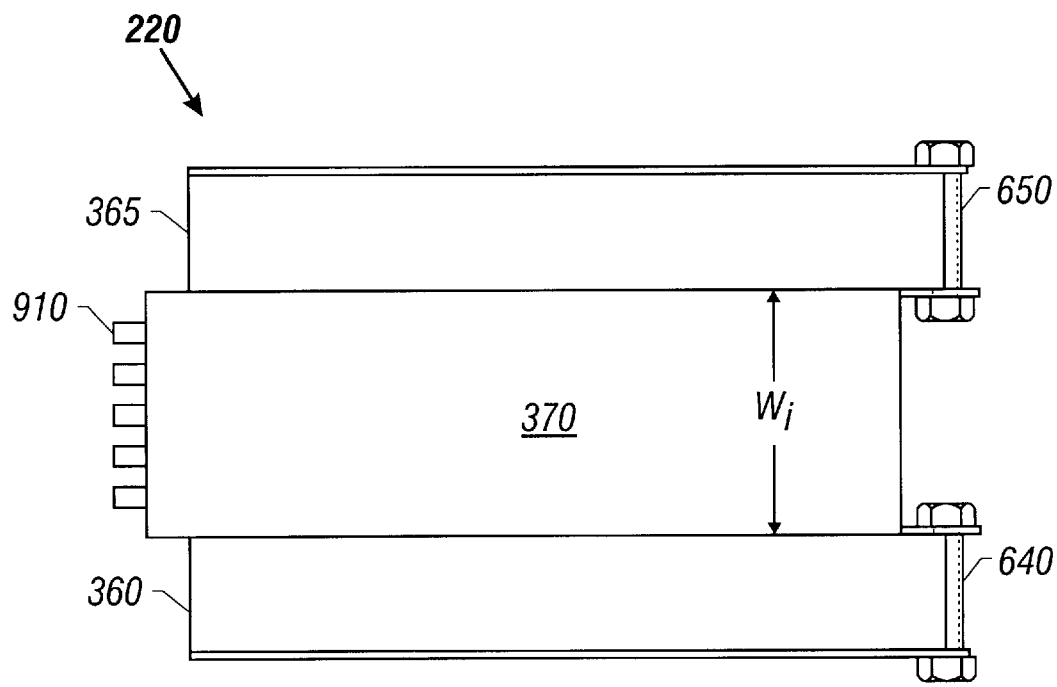
FIG. 9B is a back view of the second segment of the cable management arm.

FIG. 9b shows a back view of second segment 220. Back sides of cable channels 360 and 365 extend along the upper and lower portions of second segment 220. Receiving channel 370 is now inset so that the floor of receiving channel 370 is lower than the back side of cable channels 360 and 365. Hinge section 910 extend from the edge of receiving channel 370 for connecting second segment 220 to first segment 210.

Figure 9C:
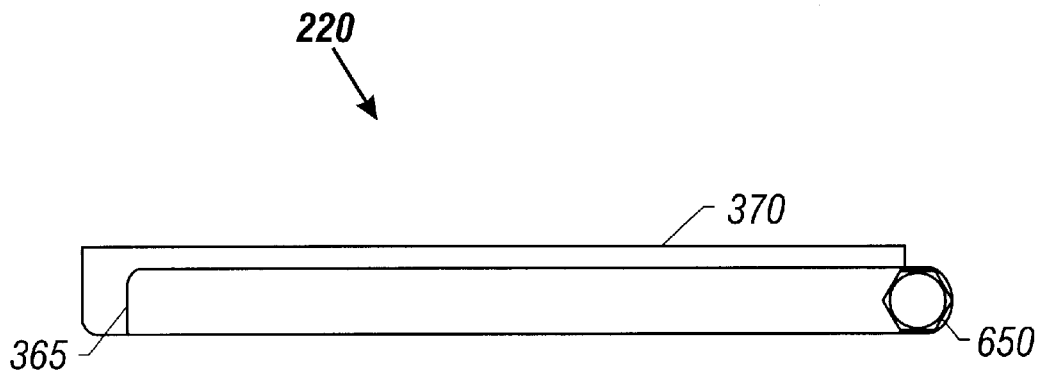
FIG. 9C is a bottom view of the second segment of the cable management arm.
Figure 9D:
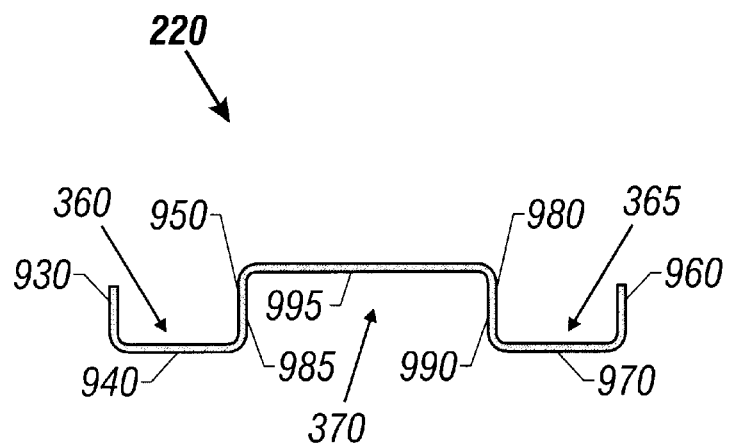
FIG. 9D is a cross sectional view of the second segment of the cable management arm.

FIG. 9c shows a bottom view of second segment 220 shown with front side (FIG. 9a) facing up. Edge and side of lower cable channel 365 is seen with a profile slightly lower than receiving channel 370. Back of receiving channel 370 is shown as the upper most surface of second segment 220. Receiving channel 370 is also shown protruding horizontally out from lower cable channel 365. Hinge plate 920 (not shown) is attached to the top surface (i.e., the backside) of the protruding horizontal surface of receiving channel 370. Top of bolt or nut from bolt/nut combination 650 can be seen as it is inserted into apertures in side walls forming lower cable channel 365.

FIG. 9d shows a cross sectional view of second segment 220 from the cross sectional line 9d—9d in FIG. 9a. Upper channel 360 is U-shaped with an outside wall 930, floor 940, and inside wall 950. Lower channel 365 is also U-shaped with an outside wall 960, floor 970, and inside wall 980. Receiving channel 370 is in an upside-down U-shape with first inside wall 985 being common with inside wall 950 and second inside wall 990 being common with inside wall 980. Floor 995 of receiving channel 370 is a planar surface connecting inside wall 985 with inside wall 990.

Figure 10A:
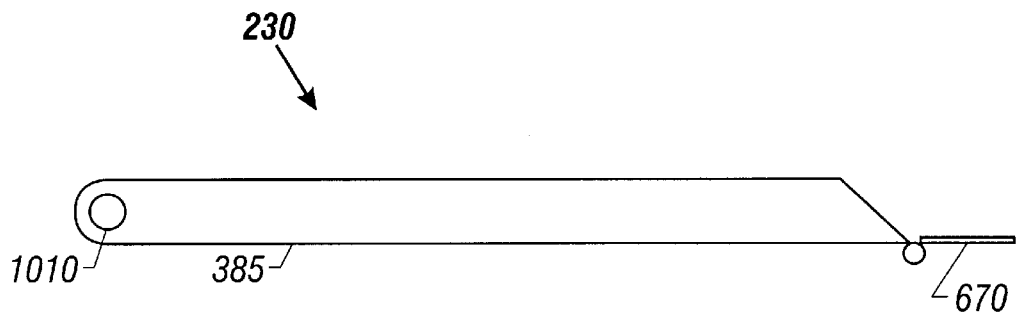
FIG. 10A is a bottom view of the third segment of the cable management arm.

Turning to FIG. 10a, a bottom view of third segment 230 is shown. Third cable tray lower side 385 is seen with apertures 1010 and 1015 (not shown) used for pivotally attaching third segment 230 with second segment 220 using bolt/nut combinations 640 and 650 (not shown). The opposite end of cable tray lower side 385 is angled to allow cables to exit third cable tray 395. Hinge 670 is used to pivotally attach third segment 230 to a component (not shown).

Figure 10B:
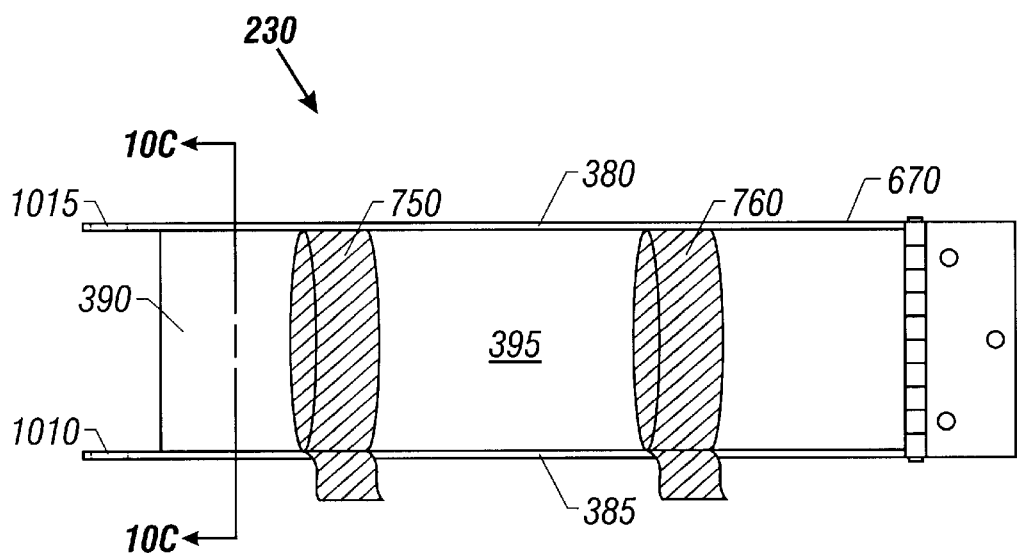
FIG. 10B is a front view of the third segment of the cable management arm.

FIG. 10b shows a front view of third segment 230. Third cable tray upper side 380 is shown along the upper edge of third segment 230 and third cable tray lower side 385 is shown along the lower edge of third segment 230 with third cable tray surface 390 connecting the respective sides. Third cable tray upper side 380 and third cable tray lower side 385 extend on the aperture (1010 and 1015) side of third segment 230 beyond third cable tray surface 390. Cable fasteners 750 and 760 are contained within third cable channel 395. Half of hinge 670 is visible with the other half connected to the back of third cable tray surface 390 to pivotally connect third segment 230 with a component (not shown).

Figure 10C:
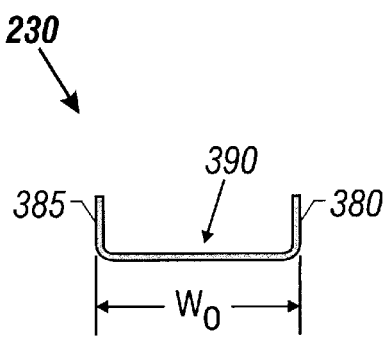
FIG. 10C is a cross sectional view of the third segment of the cable management arm.

FIG. 10c shows a cross section of third segment 230 from the cross sectional line 10c—10c shown in FIG. 10b. The cross section shows that third segment 230 is substantially U-shaped with the bottom of the U formed from third cable tray surface 390 and the sides of the U formed from third cable tray upper side 380 and third cable tray lower side 385. The outside width $w_o$ of third segment 230 is formed to fit within the interior width $w_i$ shown in FIG. 9b for second segment 220.

Figure 11:
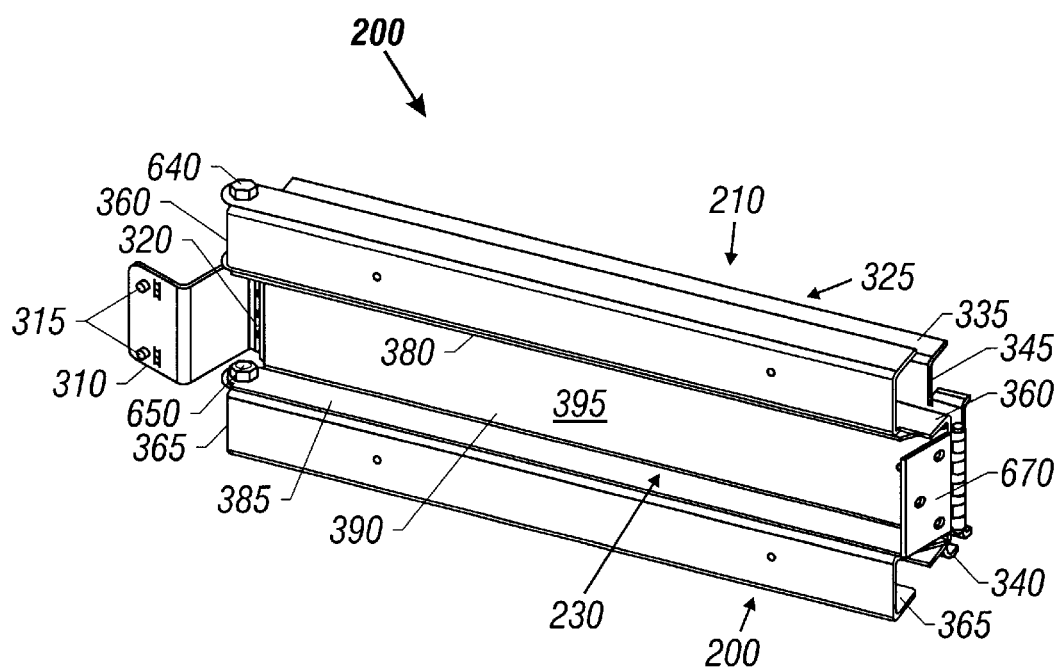
FIG. 11 is a perspective of a folded cable management arm.
Figure 15:
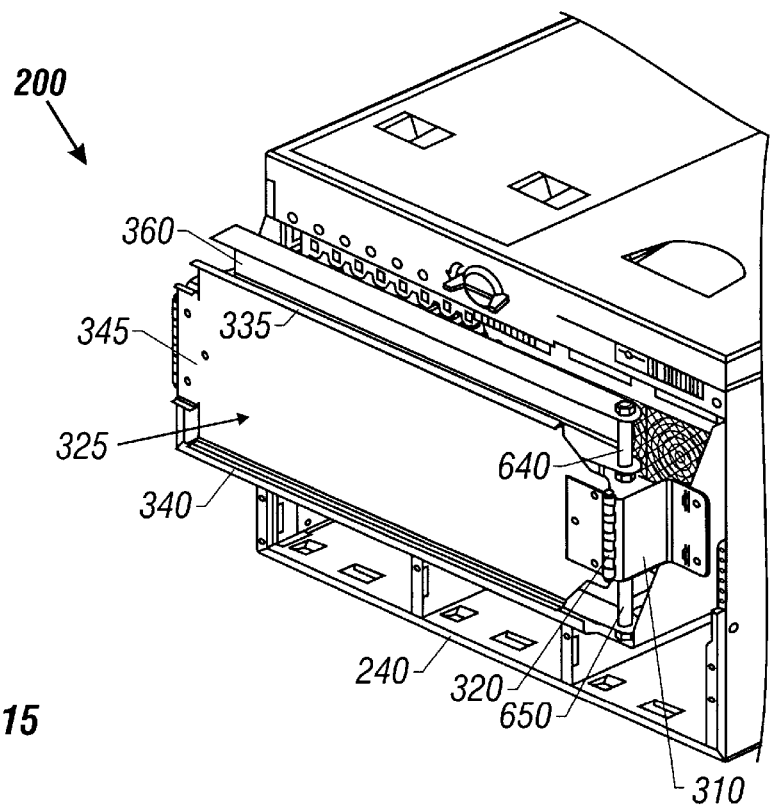
FIG. 15 is a perspective of the cable management arm folded substantially flat against the back surface of an attached component.

FIG. 11 shows a perspective of a folded cable arm 200. FIG. 11 shows how cable arm 200 would appear from a component (not shown). FIG. 15, shows the opposite perspective of folded cable arm 200 as normally viewed from the back of a rack towards component 240. Cables (not shown) would normally enter cable arm 200 in first cable tray 325 (hidden in FIG. 11, see FIG. 15 to view first cable tray 325 in folded cable arm 200) of first segment 210 at the end of first cable tray 325 near rack attachment plate 310. Cables would extend along first cable tray 325 and divide into an upper and a lower group of cables. The upper group of cables would wrap around end of first segment 210 near hinge 345 (not shown) and bend up into upper cable channel 360. Lower group of cables would wrap around end of first segment 210 near hinge 345 (not shown) and bend down into lower cable channel 365. Cables would then extend along the upper and lower cable channels 360 and 365 until reaching the ends of the cable channels near bolt/nut combinations 640 and 650. The upper and lower groups of cables would then wrap around and enter third cable tray 395 of third segment 230 which is nested in receiving channel 370. The cables extend along third cable tray 395 until they reach the component (not shown) which is attached to hinge 340.

Figure 12:
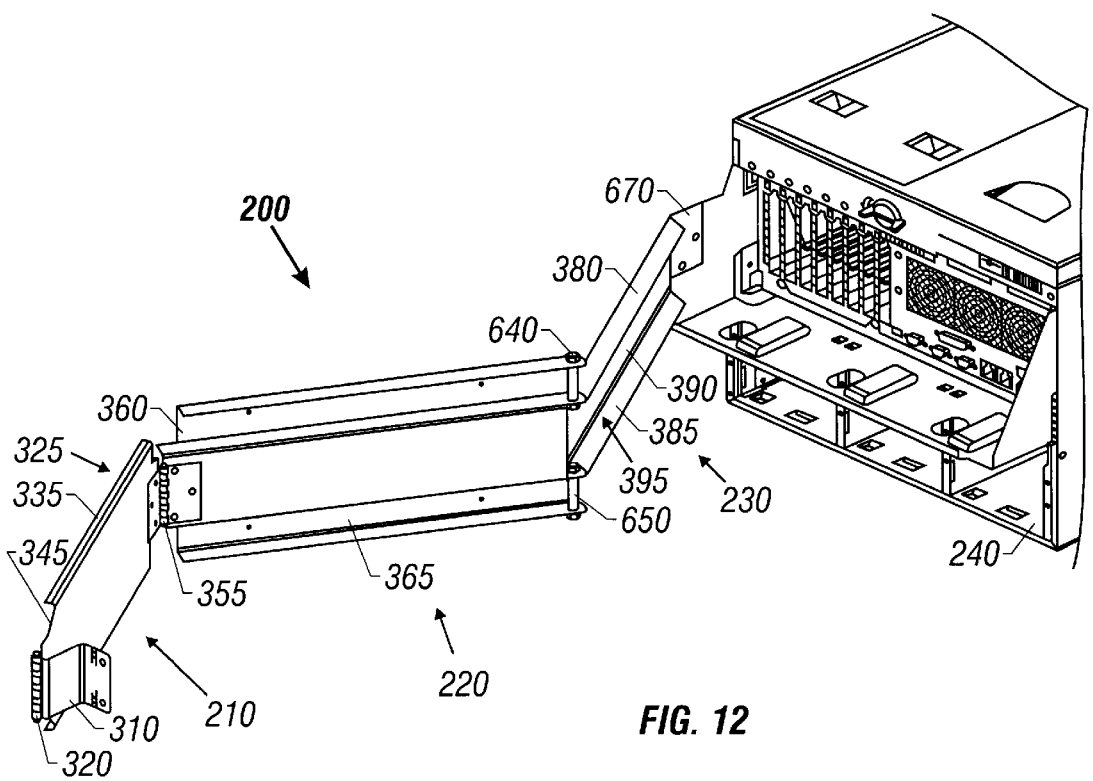
FIG. 12 is a perspective of the cable management arm extended from an attached component.
Figure 13:
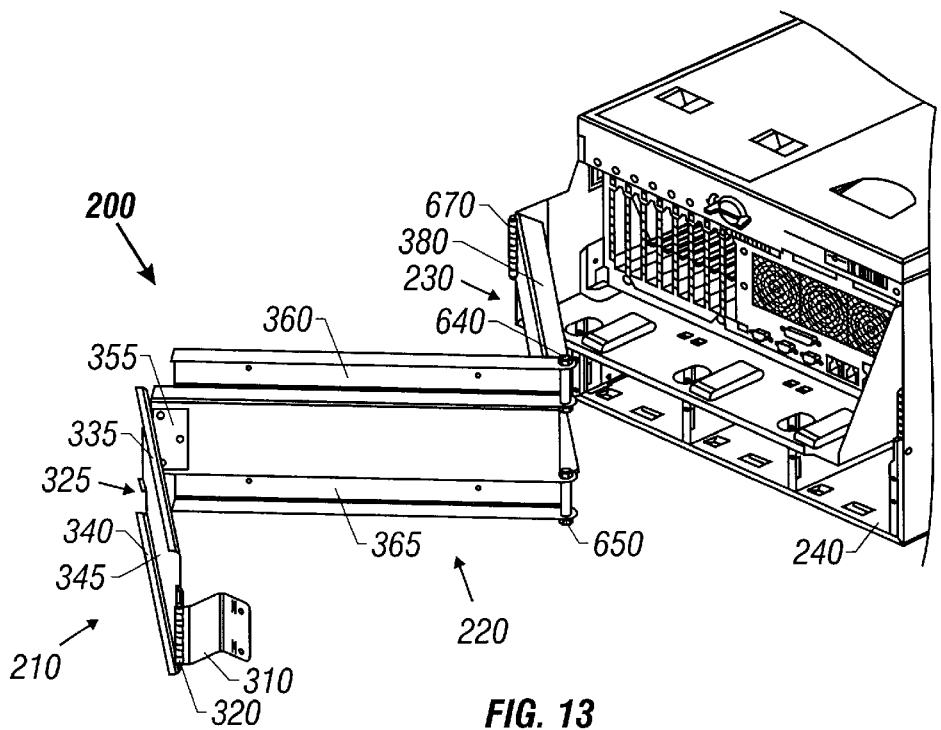
FIG. 13 is a perspective of the cable management arm being folded into an attached component.
Figure 14:
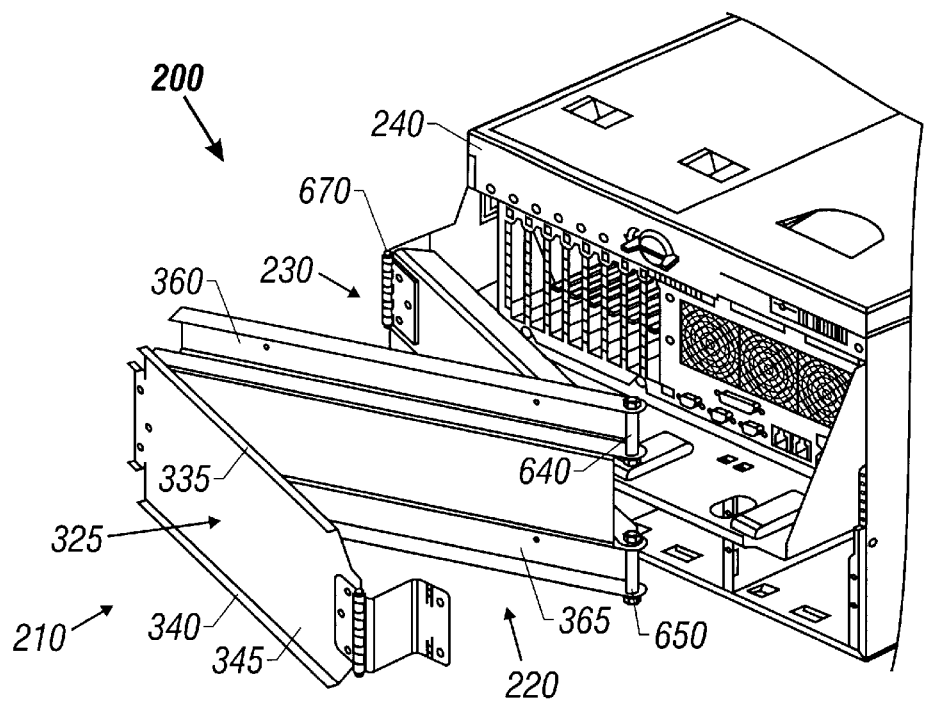
FIG. 14 is a perspective of the cable management arm being folded into an attached component.

FIGS. 12 through 15 show perspectives of cable arm 200 folding against the back of component 240. FIG. 12 shows cable arm extended from component 240 in a forwardly extended component access position. FIG. 13 shows component as it is pushed into rack (not shown) where the angles between pivotally connected segments (210, 220, and 230) of cable arm 200 become more acute. FIG. 14 shows component being pushed further into rack whereby the angles between pivotally connected segments is more acute. Finally, in FIG. 15 component 240 is moved to a rearwardly retracted operating position and cable arm 200 is compressed so that segments 210, 220, and 230 essentially lie flat against one another.

FIG. 15 shows cable arm 200 folded against back of component 240. Cables (not shown) enter cable arm 200 from rack (not shown) at rack attachment plate 310. Cables extend along first cable channel 325 before wrapping into upper and lower cable channels 360 and 365. Cables then extend along upper and lower cable channels 360 and 365 until reaching bolt/nut combinations 640 and 650. Cables then wrap around end of second segment 220 and enter third cable tray 395 (not shown). Cables extend along third cable tray 395 before attaching to component 240.

The description of the invention set forth herein is illustrative and not intended to limit the scope of the invention as set forth in the following claims. Variations and modifications of the embodiments disclosed herein may be made based on the descriptions set forth herein, without departing from the scope and spirit of the invention as set forth in the following claims.

What is claimed is:

1. A foldable cable management apparatus for holding a plurality of cables, said apparatus comprising:

a plurality of segments, ones of the plurality of segments including a cable tray and having an end pivotally attached to an end of another of the plurality of segments; and wherein one of the plurality of segments is adapted to receive another of the plurality of segments so that the depth of the received segment substantially fits within the depth of the one of the plurality of segments.

2. The apparatus as recited in claim 1, further comprising:

a first attachment plate pivotally connected to an end of one of the plurality of segments wherein the first attachment plate secures the apparatus to a rack;

a second attachment plate pivotally connected to an end of one of the plurality of segments wherein the second attachment plate secures the apparatus to a rack mounted component.

3. The apparatus as recited in claim 1, further comprising:

a cable fastener attached to at least one of the plurality of segments, the cable fastener adapted to hold a plurality of cables in the cable tray.

4. The apparatus as recited in claim 3, wherein the cable fastener is a hook-and-loop type fastener.

5. The apparatus as recited in claim 1, further comprising:

a first segment of the plurality of segments, a first end of the first segment pivotally attached to a first attachment plate, the first attachment plate securing the first segment to a rack;

a second segment of the plurality of segments, a first end of the second segment pivotally attached to a second end of the first segment, the cable tray of the second segment including a channel adapted to receive cables from the cable tray of the first segment;

a third segment of the plurality of segments, a first end of the third segment pivotally attached to a second end of the second segment and a second end of the third segment pivotally attached to a second attachment plate, the second attachment plate securing the third segment to a rack mounted component, wherein the cable tray of the third segment substantially fits within the depth of the second segment and adjacent to the channel formed in the second segment when the third segment is folded into the second segment.

6. The apparatus as recited in claim 5, wherein the cable tray of the first and second segments hold cables on a same facing side when the apparatus is folded and on opposite facing sides when the apparatus is extended, and wherein the cable tray of the second and third segments hold cables on opposite facing sides when the third segment is folded into the second segment and on a same facing side when the apparatus is extended.

7. The apparatus as recited in claim 5, further comprising:

two cable channels formed on the same side of the second segment, each cable channel extending substantially from the first end of the second segment to the second end of the second segment, one of the two cable channels formed on the upper portion of the second segment and the other formed on the lower portion of the second segment;

a receiving channel formed on the second segment on the opposite side from the two cable channels, the receiving channel formed between the two cable channels and extending substantially from the first end of the second segment to the second end of the second segment, wherein the receiving channel is adapted to receive the width and depth of the third segment when the third segment is folded into the second segment.

8. The apparatus as recited in claim 5, further comprising:

a fully extended position, wherein the apparatus is substantially straight and wherein the length of the apparatus is substantially equal to the sum of the lengths of the segments;

a folded position, wherein the segments are substantially parallel to one another, the length of the apparatus is substantially equal to the longest of the three segments, and the depth of the apparatus is less than the sum of the depths of the segments.

9. A computer system comprising:

a component;

a rack in which the component is slidably mounted;

a cable management apparatus, the cable management apparatus including:

a plurality of segments, each of the plurality of segments having an end pivotally attached to an end of another of the plurality of segments and each of the plurality of segments including a cable tray;

wherein one of the plurality of segments is adapted to receive another of the plurality of segments so that the depth of the received segment substantially fits within the depth of the one of the plurality of segments.

10. The computer system as recited in claim 9, further comprising:

a first attachment plate pivotally connected to an end of one of the plurality of segments wherein the first attachment plate secures the apparatus to a rack;

a second attachment plate pivotally connected to an end of one of the plurality of segments wherein the second attachment plate secures the apparatus to a rack mounted component.

11. The computer system as recited in claim 9, further comprising:

a cable fastener attached to at least one of the plurality of segments, the cable fastener adapted to hold a plurality of cables in the cable tray.

12. The computer system as recited in claim 11, wherein the cable fastener is a hook-and-loop type fastener.

13. The computer system as recited in claim 9, further comprising:

a first segment of the plurality of segments, a first end of the first segment pivotally attached to a first attachment plate, the first attachment plate securing the first segment to a rack;

a second segment of the plurality of segments, a first end of the second segment pivotally attached to a second end of the first segment, the cable tray of the second segment including a channel adapted to receive cables from the cable tray of the first segment;

a third segment of the plurality of segments, a first end of the third segment pivotally attached to a second end of the second segment and a second end of the third segment pivotally attached to a second attachment plate, the second attachment plate securing the third segment to a rack mounted component, wherein the cable tray of the third segment substantially fits within the depth of the second segment and adjacent to the channel formed in the second segment when the third segment is folded into the second segment.

14. The computer system as recited in claim 13, wherein the cable tray of the first and second segments hold cables on a same facing side when the apparatus is folded and on opposite facing sides when the apparatus is extended, and wherein the cable tray of the second and third segments hold cables on opposite facing sides when the third segment is folded into the second segment and on a same facing side when the apparatus is extended.

15. The computer system as recited in claim 13, further comprising:

two cable channels formed on the same side of the second segment, each cable channel extending substantially from the first end of the second segment to the second end of the second segment, one of the two cable channels formed on the upper portion of the second segment and the other formed on the lower portion of the second segment;

a receiving channel formed on the second segment on the opposite side from the two cable channels, the receiving channel formed between the two cable channels and extending substantially from the first end of the second segment to the second end of the second segment, wherein the receiving channel is adapted to receive the width and depth of the third segment when the third segment is folded into the second segment.

16. The computer system as recited in claim 13, further comprising:

a fully extended position, wherein the apparatus is substantially straight and wherein the length of the apparatus is substantially equal to the sum of the lengths of the segments;

a folded position, wherein the segments are substantially parallel to one another, the length of the apparatus is substantially equal to the longest of the three segments, and the depth of the apparatus is less than the sum of the depths of the segments.

17. A method for sliding a computer component mounted in a rack comprising:

providing a foldable cable management apparatus for holding a plurality of cables, wherein the apparatus includes a plurality of segments, ones of the plurality of segments including a cable tray and having an end pivotally attached to an end of another of the plurality of segments; and providing one of the plurality of segments adapted to receive another of the plurality of segments so that the depth of the received segment substantially fits within the depth of the one of the plurality of segments.

18. The method as recited in claim 17, further comprising:

attaching one end of a cable management apparatus to the rack and attaching the other end of the cable management apparatus to the component.

19. The method as recited in claim 17, further comprising:

pulling the component from a rearwardly retracted operating position to a forwardly extended component access position;

pivoting a plurality of segments within the cable management apparatus responsive to the pulling.

20. The method as recited in claim 17, further comprising:

extending a cable along the ones of the plurality of segments including a cable tray.

21. A foldable cable management apparatus with three segments for holding a plurality of cables, said apparatus comprising:

a first segment;

a second segment, one end of the second segment pivotally attached to one end of the first segment;

a third segment, one end of the third segment pivotally attached to the other end of the second segment;

wherein one of the three segments fits within a depth of another of the three segments when the cable management apparatus is in a rearwardly retracted operating position.

22. The apparatus as recited in claim 21, wherein one of the three segments fits within a channel formed in another of the three segments when the cable managment apparatus is in a rearwardly retracted operating position.

23. The apparatus as recited in claim 21 further comprising:

two cable channels formed on the same side of the second segment, each cable channel extending substantially from the one end of the second segment to the other end of the second segment, one of the two cable channels formed on the upper portion of the second segment and the other formed on the lower portion of the second segment;

a receiving channel formed on the second segment on the opposite side of the second segment from the two cable channels, the receiving channel formed between the two cable channels and extending substantially from the first end of the second segment to the second end of the second segment, wherein the receiving channel is adapted to receive the width and depth of the third segment when the third segment is pivoted into the second segment.

24. The apparatus as recited in claim 21, further comprising:

a forwardly extended component access position, wherein the apparatus is substantially straight and wherein the length of the apparatus is substantially equal to the sum of the lengths of the segments;

a rearwardly retracted operating position, wherein the segments are substantially parallel to one another, the length of the apparatus is substantially equal to the longest of the three segments, and the depth of the apparatus is less than the sum of the depths of the segments.

25. The apparatus as recited in claim 21, further comprising:

a first attachment plate pivotally connected to an end of the first segment wherein the first attachment plate secures the apparatus to a rack;

a second attachment plate pivotally connected to an end of the third segment wherein the second attachment plate secures the apparatus to a rack mounted component.

26. The apparatus as recited in claim 21, further comprising:

cable fasteners attached to each segment, the cable fasteners adapted to hold a plurality of cables.

27. The apparatus as recited in claim 26, wherein the cable fastener is a hook-and-loop type fastener.

* * * * *